United States Patent
Nakamura et al.

(10) Patent No.: US 12,148,844 B2
(45) Date of Patent: Nov. 19, 2024

(54) SOLAR CELL MODULE

(71) Applicant: KANEKA CORPORATION, Osaka (JP)

(72) Inventors: Junichi Nakamura, Settsu (JP); Shimpei Okamoto, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 18/157,015

(22) Filed: Jan. 19, 2023

(65) Prior Publication Data

US 2023/0163222 A1 May 25, 2023

Related U.S. Application Data

(63) Continuation of application No. PCT/JP2021/026841, filed on Jul. 16, 2021.

(30) Foreign Application Priority Data

Jul. 20, 2020 (JP) ................................. 2020-123958

(51) Int. Cl.
*H01L 31/02* (2006.01)
*H01L 31/0224* (2006.01)
(Continued)

(52) U.S. Cl.
CPC .. *H01L 31/0201* (2013.01); *H01L 31/022425* (2013.01); *H01L 31/049* (2014.12); *H01L 31/05* (2013.01)

(58) Field of Classification Search
None
See application file for complete search history.

(56) References Cited

U.S. PATENT DOCUMENTS

| | | | |
|---|---|---|---|
| 2011/0277817 A1* | 11/2011 | Ide | H01L 31/048 136/246 |
| 2013/0000696 A1* | 1/2013 | Giri | F24S 50/20 136/246 |

(Continued)

FOREIGN PATENT DOCUMENTS

| | | | |
|---|---|---|---|
| JP | 2017-092067 A | 5/2017 | |
| JP | 2017-188584 A | 10/2017 | |

(Continued)

OTHER PUBLICATIONS

Machine translation of KR101194782B1 (Year: 2012).*
International Search Report issued in PCT/JP2021/026841; mailed Aug. 31, 2021.

*Primary Examiner* — Ryan S Cannon
(74) *Attorney, Agent, or Firm* — Studebaker & Brackett PC (57) ABSTRACT

A solar battery module having high photoelectric conversion efficiency and superior aesthetic appearance. A solar battery module comprises a plate-shaped front-surface protection material having, on an exterior peripheral part, a light-blocking region that blocks light; a plurality of solar battery strings each having a plurality of solar battery cells that are aligned in one line in a first direction and connected, the plurality of solar battery strings being positioned aligned in a second direction that intersects with the first direction on the back side of the front-surface protection material; a plate-shaped or sheet-shaped back-surface protection material positioned on the back side of the plurality of solar battery strings; and a sealing material filled between the front-surface protection material and the back-surface protection material. The solar battery strings are arranged so that a portion of at least one end of the solar battery cells overlaps with the light-blocking region.

6 Claims, 4 Drawing Sheets

(51) Int. Cl.
*H01L 31/049* (2014.01)
*H01L 31/05* (2014.01)

(56) References Cited

U.S. PATENT DOCUMENTS

2017/0077343 A1* 3/2017 Morad ................ H01L 31/0747
2019/0131473 A1  5/2019 Inaba et al.
2019/0165194 A1  5/2019 Inaba et al.
2019/0280138 A1* 9/2019 Kim .................... H01L 31/0504
2019/0296171 A1  9/2019 Chang et al.

FOREIGN PATENT DOCUMENTS

| JP | 2018-107194 A | 7/2018 |
| JP | 2019-096787 A | 6/2019 |
| KR | 101194782 B1 * | 10/2012 |
| WO | 2018/173216 A1 | 9/2018 |

* cited by examiner

SOLAR CELL MODULE

CROSS-REFERENCE TO RELATED APPLICATIONS

This application claims benefit of priority to International Patent Application No. PCT/JP2021/026841, filed Jul. 16, 2021, and to Japanese Patent Application No. 2020-123958, filed Jul. 20, 2020, the entire contents of each are incorporated herein by reference.

BACKGROUND

Technical Field

The present disclosure relates to a solar cell module.

Background Art

Use of solar cells as an environmentally-friendly energy source has been spreading. For example, Japanese Unexamined Patent Application, Publication No. 2017-188584 proposes a solar cell module mountable on a roof of an automobile. An automobile or the like has a limited area where solar cell modules are installed, and therefore, in order to obtain sufficient power, the solar cell modules are required to have high photoelectric conversion efficiency. In addition, it is important for an automobile or the like to have aesthetic appearance, and therefore, the solar cell modules are required to have a good design property.

SUMMARY

In the solar cell modules disclosed in Japanese Unexamined Patent Application, Publication No. 2017-188584, solar cells are held in predetermined positions by conductors connecting the solar cells and conductors connecting solar cell strings such that a front-surface plate or the like that protects a front surface is prevented from being damaged due to displacement of the solar cells. However, with such a configuration, it is difficult to arrange the solar cells with exactly equal gapes interposed therebetween. Variations in the gaps between the solar cells may cause deterioration of the design property of the solar cell modules. In view of the foregoing, the present disclosure provides a solar cell module having high photoelectric conversion efficiency and excellent aesthetic appearance.

A solar cell module according to one aspect of the present disclosure includes a plate-shaped front-surface protection material having, on an exterior peripheral part, a light-blocking region that blocks light, a plurality of solar cell strings each having a plurality of solar cells that are connected to each other and are aligned in line in a first direction, the plurality of solar cell strings being disposed adjacent to a back side of the front-surface protection material and aligned in a second direction intersecting with the first direction, a plate-shaped or sheet-shaped back-surface protection material disposed adjacent to back sides of the plurality of solar cell strings, and a sealing material filling a space between the front-surface protection material and the back-surface protection material. Each of the solar cell strings is disposed such that the solar cell located at at least one end of the solar cell string partially overlaps with the light-blocking region.

In the solar cell module, the plurality of solar cells may include a standard cell disposed at at least a location other than both ends of the solar cell string, and an end cell disposed at at least one end of the solar cell string. The end cell has a main part having a same structure as the standard cell and an extension part provided outside in the first direction of the main part and at least partially overlapping with the light-blocking region.

In the solar cell module, the standard cell may have a rectangular planar shape, and the end cell may have a hexagonal planar shape formed by chamfering outer corners of the extension part.

In the solar cell module, the standard cell may include a semiconductor substrate, a first semiconductor layer and a second semiconductor layer that are formed on a back surface of the semiconductor substrate and are different in conductivity type from each other, a first electrode pattern layered on the first semiconductor layer, and a second electrode pattern layered on the second semiconductor layer. The first semiconductor layer may include a plurality of first end semiconductor parts that extend in the first direction and are spaced apart from each other in the second direction, and a first connection semiconductor part that extends in the second direction so as to connect the plurality of first end semiconductor parts at their ends facing one side in the first direction. The second semiconductor layer may include a plurality of second end semiconductor parts that extend in the first direction and are disposed alternately with the first end semiconductor parts in the second direction, and a second connection semiconductor part that extends in the second direction so as to connect the plurality of second end semiconductor parts at their ends facing an other side in the first direction. The first electrode pattern may include a plurality of first finger electrodes that are layered on the first end semiconductor parts and extend in the first direction, and a first bus bar electrode that is layered on the first connection semiconductor part and connects the first finger electrodes at their ends facing the one side in the first direction. The second electrode pattern may include a plurality of second finger electrodes that are layered on the second end semiconductor parts and extend in the first direction, and a second bus bar electrode that is layered on the second connection semiconductor part and connects the second finger electrodes at their ends facing the other side in the first direction.

In the solar cell module, the first semiconductor layer of the end cell on one side in the first direction may extend to the extension part, and the second semiconductor layer of the end cell on the other side in the first direction may extend to the extension part.

According to the present disclosure, there can be provided a solar cell module having high photoelectric conversion efficiency and superior aesthetic appearance.

DETAILED DESCRIPTION

Hereinafter, an embodiment of the present disclosure will be described with reference to the accompanying drawings. Note that the same or corresponding components in the drawings are denoted by the same reference signs. For the sake of simplification, illustrations, reference signs and the like of some of the members may be omitted from a figure, and in such a case, other figures should be referred to. The shapes and dimensions of various members in the drawings are adjusted for convenience and ease of viewing.

Figure 1:
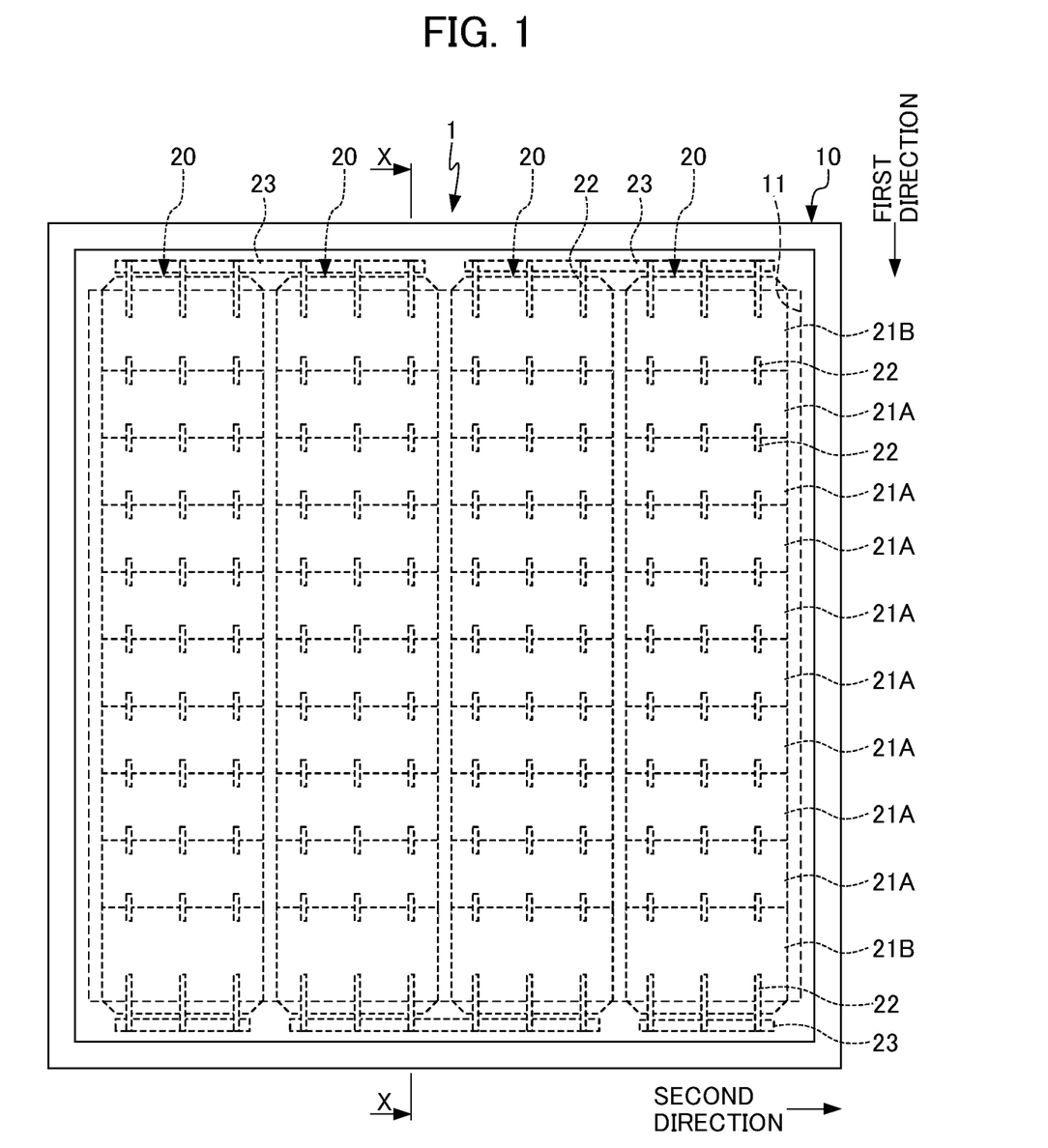
FIG. 1 is a backside view illustrating a solar cell module according to one embodiment of the present disclosure.
Figure 2:
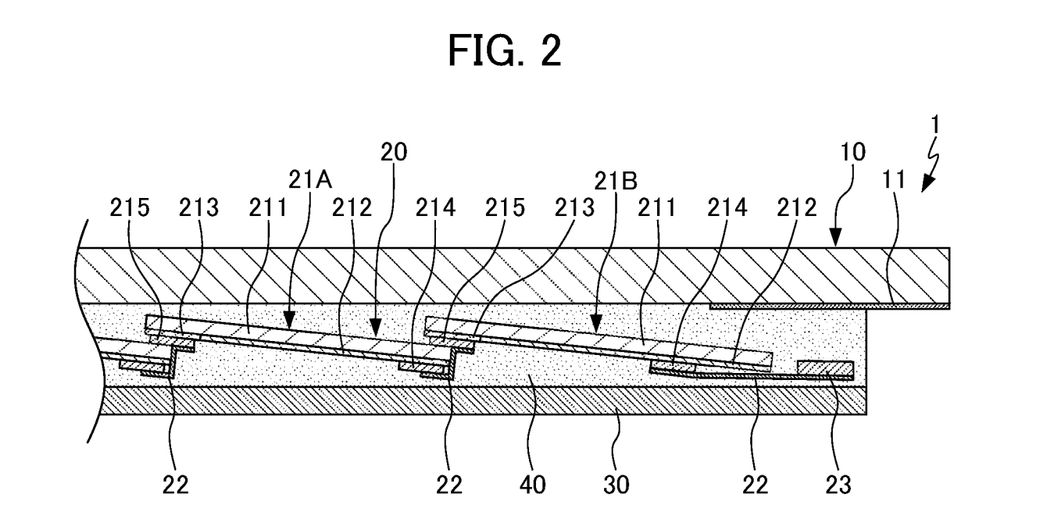
FIG. 2 is a cross-sectional view taken along line X-X of an end portion of the solar cell module of FIG. 1.

FIG. 1 is a backside view illustrating a solar cell module 1 according to one embodiment of the present disclosure. FIG. 2 is a cross-sectional view of an end portion of the solar cell module 1.

The solar cell module 1 of FIG. 1 includes a plate-shaped front-surface protection material 10, a plurality of solar cell strings 20 disposed adjacent to a back side (an opposite side to a side on which light is incident) of the front-surface protection material, a plate-shaped or sheet-shaped back-surface protection material 30 disposed adjacent to a back side of the plurality of solar cell strings 20, and a sealing material 40 that fills a space between the front-surface protection material 10 and the back-surface protection material 30.

The front-surface protection material 10 covers front surfaces of the solar cell strings 20 via the sealing material 40 to thereby protect the solar cell strings 20. The front-surface protection material 10 is formed of a transparent material having scratch resistance such as glass, polycarbonate, or acrylic resin, and is preferably excellent in weather resistance. Specifically, examples of the material of the front-surface protection material 10 may include a transparent resin such as an acrylic resin or a polycarbonate resin, and glass. In order to suppress reflection of light, the front surface of the front-surface protection material 10 may have asperities formed by way of processing or may be covered with an anti-reflective coating layer.

The front-surface protection material 10 preferably has a thickness enough to provide a strength capable of maintaining the shape of the solar cell module 1. By using the front-surface protection material 10 previously formed into a desired shape, the solar cell module 1 having the desired shape can be produced.

The front-surface protection material 10 is larger than each of the plurality of solar cell strings 20, the back-surface protection material 30, and the sealing material 40, in plan view. The front-surface protection material 10 having this configuration functions as a flange for mounting the solar cell module 1 on a desired device. In other words, the solar cell module 1 can be mounted on the device by bonding, with an adhesive, the back surface of an exterior edge of the front-surface protection material 10 to the device.

The front-surface protection material 10 has, on an exterior peripheral part, a light-blocking region 11 that blocks light. The light-blocking region 11 is normally formed to have a constant width along the exterior edge of the front-surface protection material 10. In a state where the solar cell module 1 is mounted on and fixed to a device via an adhesive, the light-blocking region 11 prevents the adhesive from being degraded due to sunlight irradiation through the front-surface protection material 10. In addition, the light-blocking region 11 covers and conceals the mounting part of the solar cell module 1 to thereby improve the aesthetic appearance. The light-blocking region 11 can be formed by applying a black paint, for example. As the black paint, a ceramic paint is generally used.

The solar cell strings 20 each include a plurality of solar cells (standard cells 21A disposed at locations other than both ends of the solar cell string 20 and end cells 21B disposed at both ends of the solar cell string) that are connected to each other and are aligned in line in a first direction. The solar cell strings 20 are disposed adjacent to the back side of the front-surface protection material 10 and aligned in a second direction intersecting with the first direction. In each of the solar cell strings 20, the solar cells 21A, 21B adjacent to each other are connected by inter connectors 22. The plurality of solar cell strings 20 are connected by wiring materials 23 via the inter connectors 22. In addition, the solar cell strings 20 are each disposed so that a portion of the end cell 21B at each end overlaps with the light-blocking region 11. Thus, each solar cell string 20 has a continuous effective region where photoelectric conversion is enabled, over the entire length in the first direction of a region inside the light-blocking region 11, thereby making the solar cell module 1 have relatively high photoelectric conversion efficiency.

Figure 3:
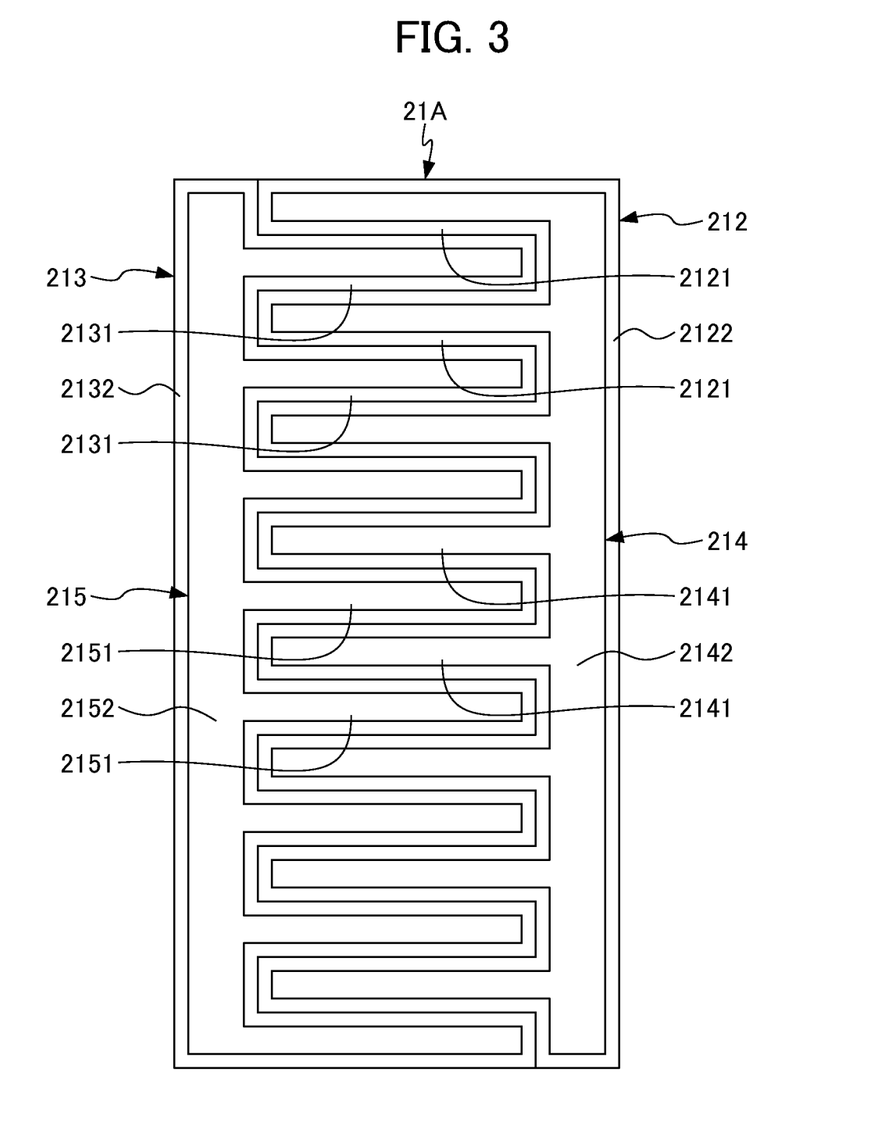
FIG. 3 is a backside view of a standard cell of the solar cell module of FIG. 1.

The standard cell 21A includes a semiconductor substrate 211, a first semiconductor layer 212 and a second semiconductor layer 213 that are formed on the back surface of the semiconductor substrate 211 and are different in conductivity type from each other, a first electrode pattern 214 layered on the first semiconductor layer 212, and a second electrode pattern 215 layered on the second semiconductor layer 213.

In planar view, the semiconductor substrate 211 of the standard cell 21A, i.e., the standard cell 21A has a rectangular shape. The semiconductor substrate 211 can be formed from a crystalline silicon material such as single crystal silicon or polycrystalline silicon. Alternatively, the semiconductor substrate 211 may be formed from other semiconductor materials such as gallium arsenic (GaAs). The semiconductor substrate 211 is, for example, an n-type semiconductor substrate including a crystalline silicon material doped with an n-type dopant. The n-type dopant may be, for example, phosphorus (P). The semiconductor substrate 211 functions as a photoelectric conversion substrate to generate photocarriers (electrons and holes) when absorbing light incident on a light receiving surface. When the semiconductor substrate 211 is made of crystalline silicon, a dark current can be kept relatively low, and relatively high power (stable power regardless of illumination intensity) can be obtained even if the incident light has low intensity.

The first semiconductor layer 212 and the second semiconductor layer 213 have different conductivity types from each other. The first semiconductor layer 212 and the second semiconductor layer 213 generate a large number of carriers different from each other to thereby form an electrical field for attracting the carriers generated by the semiconductor substrate 211.

Specifically, the first semiconductor layer 212 is formed from a p-type semiconductor, and the second semiconductor layer 213 is formed from an n-type semiconductor. The first semiconductor layer 212 and the second semiconductor layer 213 each can be formed from, for example, an amorphous silicon material containing a dopant imparting a desired conductivity type. A p-type dopant may be, for example, boron (B), and an n-type dopant may be, for example, phosphorus (P) described above.

As shown in detail in FIG. 3, the first semiconductor layer 212 includes a plurality of first end semiconductor parts 2121 that extend in the first direction and are spaced apart from each other in the second direction intersecting the first direction, and a first connection semiconductor part 2122 that extends in the second direction so as to connect the plurality of first end semiconductor parts 2121 at their ends facing one side in the first direction. The second semiconductor layer 213 includes a plurality of second end semiconductor parts 2131 that extend in the first direction and are disposed alternately with the first end semiconductor parts 2121 in the second direction, and a second connection semiconductor part 2132 that extends in the second direction so as to connect the plurality of second end semiconductor parts 2131 at their ends facing the other side in the first direction.

The first electrode pattern 214 is provided to extract the electric charges from the first semiconductor layer 212, and the second electrode pattern 215 is provided to extract the electric charges from the second semiconductor layer 213. The first electrode pattern 214 and the second electrode pattern 215 are layered while margins are left in the exterior edges of the first semiconductor layer 212 and the second semiconductor layer 213 such that a short circuit is prevented. The first electrode pattern 214 and the second electrode pattern 215 may be formed by means of, for example, etching of a metal layer or printing and baking of the conductive paste. Alternatively, the first electrode pattern 214 and the second electrode pattern 215 may be laminates that are layered on the first semiconductor layer 212 and the second semiconductor layer 213, respectively, and that each includes a transparent electrode layer made of, for example, indium tin oxide (ITO) or zinc oxide (ZnO), and a metal electrode layer including a metal as a main constituent.

Specifically, the first electrode pattern 214 includes a plurality of first finger electrodes 2141 that are layered on the first end semiconductor parts 2121 and extend in the first direction, and a first bus bar electrode 2142 that is layered on the first connection semiconductor part 2122 and connects the first finger electrodes 2141 at their ends facing the one side in the first direction. The second electrode pattern 215 includes a plurality of second finger electrodes 2151 that are layered on the second end semiconductor parts 2131 and extend in the first direction, and a second bus bar electrode 2152 that is layered on the second connection semiconductor part 2132 and connects the second finger electrodes 2151 at their ends facing the other side in the first direction. The first bus bar electrode 2142 and the second bus bar electrode 2152 have widths greater than the widths of the first finger electrode 2141 and the second finger electrode 2151, and are also used as terminals to which the inter connectors 22 are connected so as to output electric power from the standard cell 21A.

Figure 4:
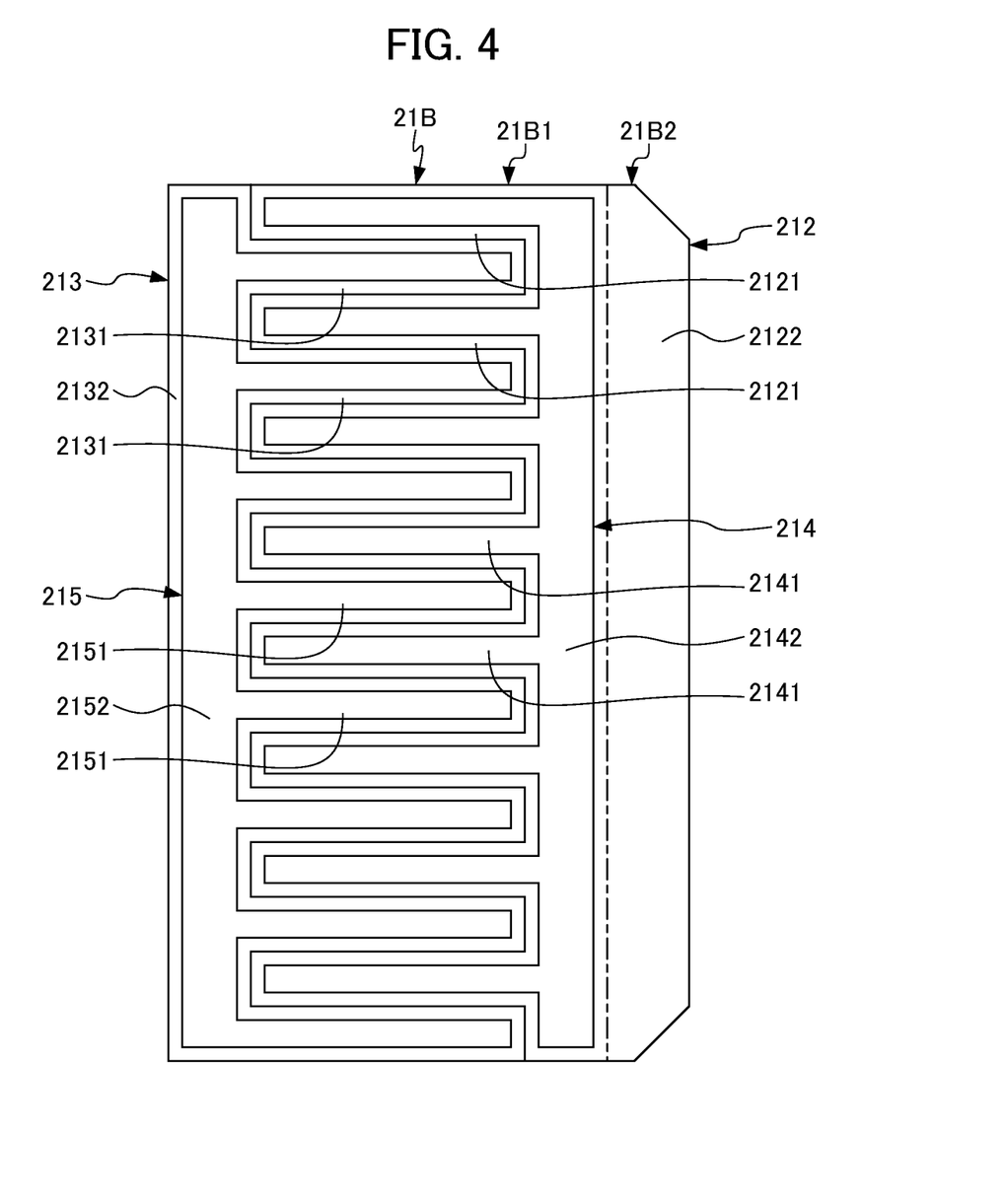
FIG. 4 is a backside view of an end cell of the solar cell module of FIG. 1.

As shown in FIG. 4, the end cell 21B includes a main part 21B1 having the same structure as the standard cell 21A, and an extension part 21B2 that is provided outside in the first direction of the main part 21B1 and at least partially overlaps with the light-blocking region 11 (the one-dot chain line in FIG. 4 indicates a boundary between the main part 21B1 and the extension part 21B2). The extension part 21B2 is formed by extending a portion toward outside in the first direction of the semiconductor substrate 211 forming the main part 21B1, and a portion toward outside in the first direction of the first connection semiconductor part 2122 or the second connection semiconductor part 2132 of the main part 21B1. Specifically, the first semiconductor layer 212 of the end cell 21B on the one side in the first direction extends to the extension part 21B2, while the second semiconductor layer 213 of the end cell 21B on the other side in the first direction extends to the extension part 21B2.

In the solar cell string 20, the extension parts 21B2 of the end cells 21B are prevented from receiving light by the light-blocking region 11, which makes the end cells 21B partially unable to contribute to the photoelectric conversion, whereas the main parts 21B1 are not prevented from receiving light by the light-blocking region 11, which makes it possible for the end cells 21B to output substantially same amount of electric power as the standard cells 21A. Accordingly, in the solar cell string 20, the outputs of all the solar cells 21A, 21B are substantially equal to each other, and therefore the solar cell string 20 as a whole is excellent in the photoelectric conversion efficiency.

The standard cells 21A and the end cells 21B may be formed by dividing a semiconductor wafer into a plurality of pieces in the first direction. The extension part 21B2 of the end cell 21B can be formed of an end region of the semiconductor wafer. Accordingly, the end cell 21B has a hexagonal planar shape formed by chamfering outer corners of the extension part 21B2, whereby the use efficiency of the semiconductor wafer can be improved. In addition, the standard cell 21A is obtained by cutting off the extension part 21B2 from the end cell 21B, and therefore, the number of standard cells 21A and the number of end cells 21B can be easily adjusted according to a configuration of the solar cell string 20.

The lower limit of the length in the first direction of the extension part 21B2 is preferably 1 mm, and more preferably 3 mm. On the other hand, the upper limit of the length in the first direction of the extension part 21B2 is preferably 20 mm, and more preferably 15 mm Setting the length in the first direction of the extension part 21B2 to the above-described lower limit or more makes it possible to efficiently prevent the aesthetic appearance from being degraded due to positional errors of the solar cell strings 20 that can be caused at the time of assembling the solar cell module 1. Setting the length in the first direction of the extension part 21B2 to the above-described upper limit or less makes it possible to achieve a relatively high use efficiency of the semiconductor wafer when the solar cells 21A and 21B are produced.

The back-surface protection material 30 is a layer that protects the back sides of the solar cell strings 20. The back-surface protection material 30 may be made of any material, but is preferably made of a material capable of preventing infiltration of water and the like (highly water-impermeable material). Specifically, the back-surface protection material 30 may be made of, for example, glass, or a resin such as polyethylene terephthalate (PET), an acrylic resin, polyethylene (PE), an olefin resin, a fluorine-containing resin, or a silicone-containing resin. Alternatively, the back-surface protection material 30 may be a laminate of a resin layer and a metal layer such as an aluminum foil. The color (light reflection characteristics) of the back-surface protection material 30 as viewed from the front side surface is preferably approximate to the color of the front side surfaces of the solar cells 21A, 21B such that gaps between the solar cell strings 20 are made inconspicuous, thereby improving the aesthetic appearance of the solar cell module 1.

The sealing material 40 seals the solar cell strings 20 in the space between the front-surface protection material 10 and the back-surface protection material 30, thereby suppressing the degradation of the solar cell strings 20 due to moisture or the like. The sealing material 40 is formed from a transparent material having adhesiveness to the front-surface protection material 10 and the solar cell strings 20. The material of the sealing material 40 preferably has thermoplasticity so that the space between the front-surface protection material 10 and the solar cell strings 20 can be sealed by heat pressing. Specifically, examples of the material of the sealing material 40 include a resin composition containing, as a main component, ethylene-vinyl acetate copolymer (EVA), ethylene-α-olefin copolymer, ethylene-vinyl acetate-triallyl isocyanurate (EVAT), polyvinyl butyrate (PVB), an acrylic resin, a urethane resin, or a silicone resin.

While an embodiment of the present disclosure has been described in the foregoing, the above embodiment is not intended to limit the present disclosure and may be altered or modified in various ways. For example, a specific structure of the solar cells in the solar cell module according to the present disclosure, such as the planar shapes of the semiconductor layer and the electrode pattern, may be different from those of the above embodiment. Alternatively, the solar cell strings may include solar cells all having the same structure.

In the solar cell module according to the present disclosure, each solar cell string may have only one end overlapping with the light-blocking region. Accordingly, the solar cell string of the solar cell module according to the present disclosure may include, at only one end, the end cell having the extension part.

In the solar cell module according to the present disclosure, the back-surface protection material and the sealing material may have the same planar shape as the front-surface protection material. In particular, in a case where the back-surface protection material is formed from a rigid material such as glass, the exterior edge of the back-surface protection material may be bonded to a frame of an automobile or the like with an adhesive.

What is claimed is:

1. A solar cell module, comprising:
a plate-shaped front-surface protection material having, on an exterior peripheral part, a light-blocking region that blocks light;
a plurality of solar cell strings each having a plurality of solar cells that are connected to each other and are aligned in line in a first direction, the plurality of solar cell strings being disposed adjacent to a back side of the front-surface protection material and aligned in a second direction intersecting with the first direction, and each of the solar cell strings being disposed such that end cells of the plurality of solar cells disposed at both ends of the solar cell strings at least partially overlap with the light-blocking region;
a plate-shaped or sheet-shaped back-surface protection material disposed adjacent to back sides of the plurality of solar cell strings; and
a sealing material filling a space between the front-surface protection material and the back-surface protection material,
wherein the plurality of solar cells of a solar cell string of the plurality of solar cell strings include:
a standard cell disposed at at least a location other than the both ends of the solar cell string; and
the end cells disposed at the both ends of the solar cell string, the end cells each having a main part having a same structure as a structure of the standard cell and an extension part provided outside in the first direction of the main part and at least partially overlapping with the light-blocking region, and the extension parts of the end cells being disposed only at the both ends of the cell string.

2. The solar cell module according to claim 1, wherein the standard cell has a rectangular planar shape, and each of the end cells has a hexagonal planar shape formed by chamfering outer corners of the extension part.

3. The solar cell module according to claim 1, wherein the structure of the standard cell comprises: a semiconductor substrate; a first semiconductor layer and a second semiconductor layer that are formed on a back surface of the semiconductor substrate and are different in conductivity type from each other; a first electrode pattern layered on the first semiconductor layer; and a second electrode pattern layered on the second semiconductor layer, the first semiconductor layer includes: a plurality of first end semiconductor parts that extend in the first direction and are spaced apart from each other in the second direction; and a first connection semiconductor part that extends in the second direction so as to connect the plurality of first end semiconductor parts at their ends facing one side in the first direction, the second semiconductor layer includes: a plurality of second end semiconductor parts that extend in the first direction and are disposed alternately with the first end semiconductor parts in the second direction; and a second connection semiconductor part that extends in the second direction so as to connect the plurality of second end semiconductor parts at their ends facing an other side in the first direction, the first electrode pattern includes: a plurality of first finger electrodes that are layered on the first end semiconductor parts and extend in the first direction; and a first bus bar electrode that is layered on the first connection semiconductor part and connects the first finger electrodes at their ends facing the one side in the first direction, and the second electrode pattern includes: a plurality of second finger electrodes that are layered on the second end semiconductor parts and extend in the first direction; and a second bus bar electrode that is layered on the second connection semiconductor part and connects the second finger electrodes at their ends facing the other side in the first direction.

4. The solar cell module according to claim 3, wherein the end cells each have the main part having the same structure as the structure of the standard cell and the extension part, the first semiconductor layer of an end cell of the end cells on the one side in the first direction extends to the extension part on the one side, and the second semiconductor layer of an end cell of the end cells on the other side in the first direction extends to the extension part on the other side.

5. The solar cell module according to claim 2, wherein the structure of the standard cell comprises: a semiconductor substrate; a first semiconductor layer and a second semiconductor layer that are formed on a back surface of the semiconductor substrate and are different in conductivity type from each other; a first electrode pattern layered on the first semiconductor layer; and a second electrode pattern layered on the second semiconductor layer, the first semiconductor layer includes: a plurality of first end semiconductor parts that extend in the first direction and are spaced apart from each other in the second direction; and a first connection semiconductor part that extends in the second direction so as to connect the plurality of first end semiconductor parts at their ends facing one side in the first direction, the second semiconductor layer includes: a plurality of second end semiconductor parts that extend in the first direction and are disposed alternately with the first end semiconductor parts in the second direction; and a second connection semiconductor part that extends in the second direction so as to connect the plurality of second end semiconductor parts at their ends facing an other side in the first direction, the first electrode pattern includes: a plurality of first finger electrodes that are layered on the first end semiconductor parts and extend in the first direction; and a first bus bar electrode that is layered on the first connection semiconductor part and connects the first finger electrodes at their ends facing the one side in the first direction, and the second electrode pattern includes: a plurality of second finger electrodes that are layered on the second end semiconductor parts and extend in the first direction; and a second bus bar electrode that is layered on the second connection semiconductor part and connects the second finger electrodes at their ends facing the other side in the first direction.

6. The solar cell module according to claim 5, wherein the end cells each have the main part having the same structure as the structure of the standard cell and the extension part, the first semiconductor layer of an end cell of the end cells on the one side in the first direction extends to the extension part on the one side, and the second semiconductor layer of an end cell of the end cells on the other side in the first direction extends to the extension part on the other side.

* * * * *